United States Patent [19]
Pai

[11] Patent Number: 5,871,868
[45] Date of Patent: Feb. 16, 1999

[54] APPARATUS AND METHOD FOR MACHINING CONDUCTIVE STRUCTURES ON SUBSTRATES

[75] Inventor: Deepak Keshav Pai, Burnsville, Minn.

[73] Assignee: General Dynamics Information Systems, Inc., Falls Church, Va.

[21] Appl. No.: 23,602

[22] Filed: Feb. 26, 1993

[51] Int. Cl.⁶ .................................................. G03F 9/00
[52] U.S. Cl. .................................................................. 430/5
[58] Field of Search ............................. 430/5, 321, 322, 430/324, 325, 326

[56] References Cited

U.S. PATENT DOCUMENTS

| | | |
|---|---|---|
| 3,562,009 | 2/1971 | Cranston et al. . |
| 3,596,045 | 7/1971 | Steigerwald et al. ................... 219/121 |
| 3,656,988 | 4/1972 | Steffen et al. ............................ 117/5.5 |
| 4,675,246 | 6/1987 | Kundinger et al. ...................... 428/336 |
| 4,764,485 | 8/1988 | Loughran et al. ........................ 437/225 |
| 4,954,383 | 9/1990 | King et al. ............................... 428/131 |
| 4,959,119 | 9/1990 | Lantzer .................................... 156/644 |

FOREIGN PATENT DOCUMENTS 2121387   5/1990   Japan .

OTHER PUBLICATIONS

Electronics Manufacturing Productivity Facility, Electrecon '91 Proceedings, Oct. 22–23, 1991.

*Primary Examiner*—S. Rosasco
*Attorney, Agent, or Firm*—Kinney & Lange, P.A.

[57] ABSTRACT

The present invention is an apparatus and method for machining a laminate structure to form a selected shape. The method includes forming a first layer on a substrate. A first protective structure is defined that is attached to each of the first layer and the substrate. At least a portion of the protective structure has the selected shape. The laminate structure is then machined along the first protective structure thereby forming at least a portion of the selected shape.

11 Claims, 1 Drawing Sheet

APPARATUS AND METHOD FOR MACHINING CONDUCTIVE STRUCTURES ON SUBSTRATES

BACKGROUND OF THE INVENTION

The present invention relates to an apparatus and method for machining a laminate structure to form selected shapes and, more particularly, to a method for machining conductive structures on substrates to form selected shapes.

Conductive structures on substrates such as thin film circuits are presently in use in high performance, high density systems. These thin film circuits include a substrate or base material upon which conductive structures are deposited. This thin film circuit provides electrical interconnections for components that are electrically connected to the conductive structures. These components that are mounted to the thin film circuit are frequently very large scale integrated circuits (VLSI).

The thin film technology used in the manufacture of these thin film circuits provides relatively short interconnection distance and low interconnection capacitance between integrated components, which enhances the system performance. Thin film technology frequently makes use of multiple layers of thin film conducting material. Thin film conducting layers are separated by dielectric material such as polyimide. Each layer of conducting material is defined using known processes such as a photolithographic process. Thin film processing is generally described in the article entitled "Multichip Modules for High Performance Military Electronics" by T. A. Krinke and D. K. Pai from *Electricon* '91 proceedings, sponsored by the Electronics Manufacturing Productivity Facility, Indianapolis, Ind., Oct. 22 and 23, 1991, and incorporated herein by reference.

The thin film circuit is frequently mounted to a heat sink which provides mechanical strength and improved thermal conductivity between the substrate and a chassis in which the heat sink is mounted. Alternatively, the thin film circuit can be mounted directly to the chassis.

The chassis in which the thin film circuit is mounted may have a variety of external shapes in order to make optimal use of the space available for a given application. For example, a chassis may have a cylindrical exterior shape or form to make optimal use of a volume within a portion of a missile.

Because the thin film circuits are mounted within the chassis, these thin film circuits must be machined to conform with the interior shape or form of the chassis. One method that has been used for machining these thin film circuits is to saw the thin film circuit using a conventional high speed saw. These saws are frequently equipped with a circular carbide tipped saw blade. However, a major drawback of this sawing technique for machining the thin film circuit is that these saws are best suited for cutting relatively straight edges and are not well suited for cutting relatively small radius arcs or curves. The thin film circuit often must have at least portions thereof machined in relatively small radius arcs or curves.

Other techniques that have been used for machining thin film circuits are ultrasonic or laser techniques. A major drawback of both the ultrasonic and laser machining techniques is that each of these techniques tend to delaminate the thin film circuit. This delamination may be either between polyimide layers or between a polyimide layer and the substrate.

There is an ever present need for methods and apparatus for machining thin film circuits to form nonlinear portions such as relatively small radius arcs or curves therein. This machining should be capable of producing nonlinear sides of the thin film circuit that are free from nicks and delamination.

SUMMARY OF THE INVENTION

One aspect of the present invention is a method for manufacturing a laminate structure to form a selected shape. The method includes laminating a first layer onto a surface of a substrate to form a laminate structure. A first protective structure is formed in the first layer and on the substrate. At least a portion of the first protective structure defines the selected shape. The laminate structure is then machined along the first protective structure to form at least a portion of the selected shape. In one preferred embodiment, the substrate is ceramic, the first layer is polyimide and the first protection structure is copper.

Another aspect of the present invention is a laminate structure made from conductive structures on substrates that is suited for machining to a selected shape. The structure includes a substrate, a first dielectric layer formed on the substrate and a protective structure. The protective structure is positioned at least partially within the first dielectric layer and attached to the substrate. The protective structure at least partially defines the selected shape of the laminate structure. In one preferred embodiment, the substrate is ceramic, the first layer is polyimide and the protective structure is copper.

Yet another aspect of the present invention is a mask for use with a photographic process for defining at least a portion of a laminate structure having a selected shape. The mask includes a masking portion for defining a protective structure in each of a plurality of superimposed layers of the laminate structure. The protective structure extends in a second direction along at least a portion of the selected shape. The protective structure defining a region along which the laminate structure may be machined so that delamination of the laminate structure does not occur along the protective structure during machining. In one preferred embodiment, the mask is a layer of glass having a layer of chromium applied to the surface thereof.

DETAILED DESCRIPTION OF THE PREFERRED EMBODIMENTS

Figure 1:
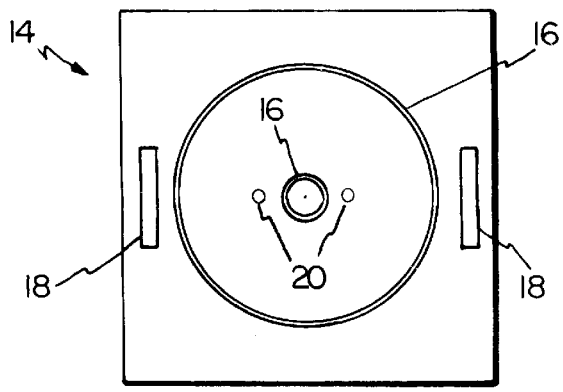
FIG. 1 is a top plan view of a mask for defining a protective structure for conductive structures or substrates.

The representations of the thin film circuit as disclosed in FIGS. 1 through 4 are greatly simplified and not drawn to scale for the purposes of clarity of illustration and disclosure of the method and apparatus of this invention. More specifically, the structure and electrical circuit as well as the integrated circuits and interconnections to the integrated circuits are not shown, and the thickness of the various layers is greatly exaggerated and not shown in the desired proportions. In the following description, the necessary artwork and the conventional steps that are normally used in the manufacture of the thin film circuit are not described as they are well known.

FIGS. 1 through 4 disclose a method and apparatus for machining laminate structures such as conductive structures on substrates of the present invention. The method of the present invention is used for fabricating a laminate structure 10 that includes a protective structure 12. Another aspect of the present invention is a method for machining the laminate structure 10 shown in FIG. 2 to form the laminate structure 10' shown in FIGS. 3 and 4. Yet another aspect of the present invention is a protective structure mask 14 shown in FIG. 1 that is used according to the method of the present invention to form the laminate structure 10 shown in FIG. 2 that includes the protective structure 12.

Laminate structures formed by conductive structures on substrates such as thin film circuits are known. Thin film technology has been used for electrical interconnection of integrated circuits and discrete components. This thin film technology involves use of high conductivity metal films that are deposited on a substrate. Thin film technology is particularly well suited to high speed systems which require high packaging density. The use of thin film technology for these systems, instead of the more traditional printed wiring board (PWB) technology, provides reduced interconnection distances between the integrated components and low capacitance interconnects, both of which enhance system performance.

Thin film processing technology involves photolithography steps which are utilized to produce patterned masking layers on the substrate which in turn are utilized to create various features such as different layers of conductive film, resistors, capacitors, and vias for interconnecting different layers of conducting film. These thin film conducting layers are separated by a dielectric material such as polyimide. Connections between the various layers of conductive film are accomplished with a vertical interconnection frequently referred to as a "via."

Vias are frequently formed by using a photo mask to define the via location and plating a conductive material, thereby forming the vertical electrical interconnection to selected conductive layers that are aligned with this via. The method of forming vias is known and therefore will not be discussed here in detail. It suffices to say, however, that the various features of the thin film circuit as well as vias can be formed by selective deposit of conductive material directly through photoresist masks or by a subtractive process. The subtractive process makes use of a uniform film that is deposited on the substrate followed by the selective removal of material from the individual layers. This selective removal of material from the individual layers can be accomplished using a photolithographic process and a selective etch. A conductive material such as copper is then deposited using a deposition technique such as plating.

Depicted in FIG. 1 is a protective structure mask 14 of the present invention for use in a process involving the photographic transfer of patterns on the protective structure mask 14 to the thin film circuit 10. The protective structure mask 14 includes a protective structure masking portion 16, alignment marks 18 and a vertical interconnect, or via, masking portion 20. The masking portion 16 is used to define the protective structure 12 shown in FIG. 2. The protective structure 12 is positioned on the thin film circuit 10 along at least a portion of the thin film circuit that is to be machined. The alignment marks 18 are conventional alignment structures that provide a means for aligning the protective structure mask 14 with the thin film circuit 10. The via masking portion 20 defines, in a conventional manner, vertical interconnects between different layers that make up the thin film circuit, as will be discussed later.

Figure 3:
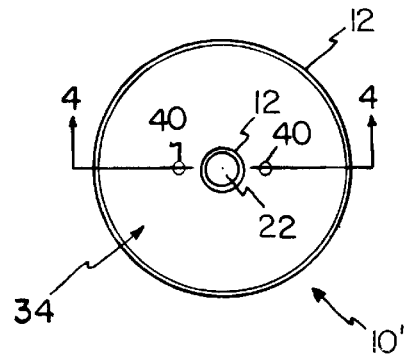
FIG. 3 is a top plan view of the substrate, four-layer thin film circuit and protective structure of FIG. 2 shown after machining.
Figure 4:
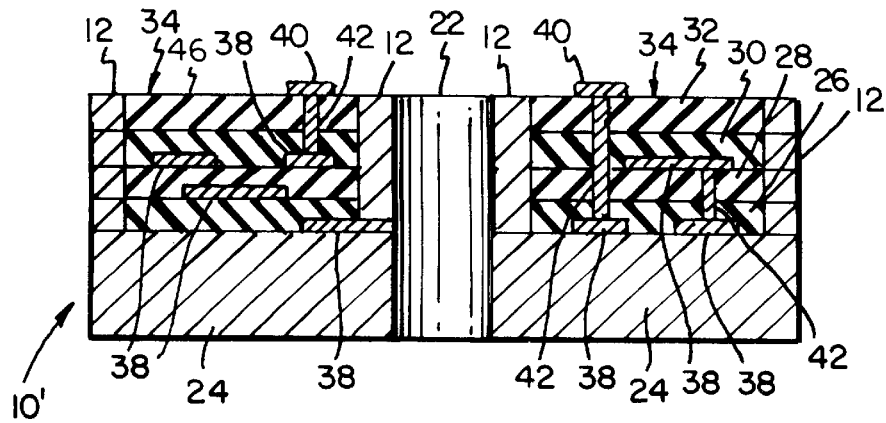
FIG. 4 is a cross section shown greatly enlarged of the substrate, four-layer thin film circuit and protective structure shown in FIG. 3.

The protective structure masking portion 16 shown in FIG. 1 includes an inner masking portion and an outer masking portion. The outer and inner masking portions form concentric circles. These outer and inner masking portions define an outer and inner protective structure 12 on the thin film circuit 10. The outer and inner protective structure 12 is positioned along those portions of the thin film circuit 10 that require machining to form the thin film circuit 10' having a selected shape. The protective structure masking portion 16 shown in FIG. 1 is just one example of a protective structure masking portion 16 for a thin film circuit 10 that is machined to form thin film circuit 10' having a circular shape with a centrally located bore 22 therein, as shown in FIGS. 3 and 4. The protective structure masking portion 16 in general has a shape that is dependent on both the machining required for the thin film circuit 10 and the type of machining required, i.e. sawing, laser, ultrasonic machining, as will be discussed later.

Figure 2:
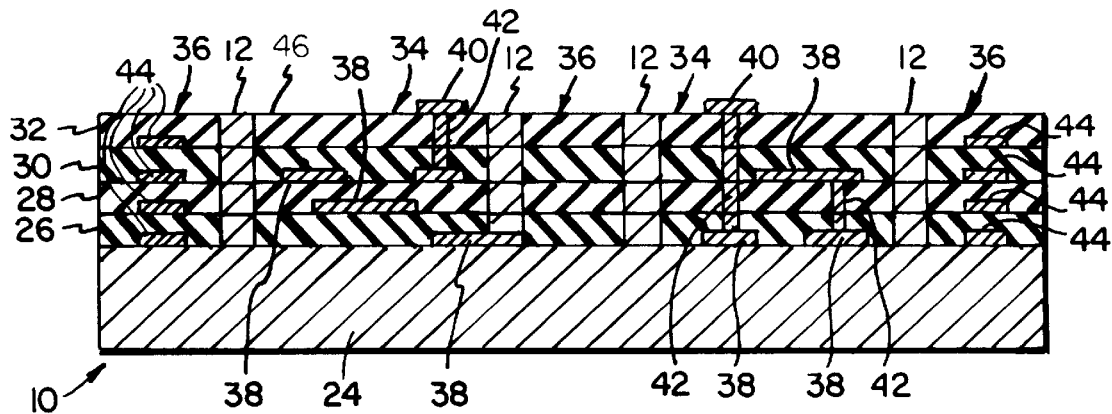
FIG. 2 is a cross section shown greatly enlarged of a substrate having a four-layer thin film circuit thereon and a protective structure therein defined using the mask of FIG. 1.

The thin film circuit 10 shown in FIG. 2 includes a lower base portion or substrate 24 having four superimposed circuit layers 26, 28, 30 and 32. The thin film circuit 10 includes a circuit portion 34 and a non-circuit portion 36. The circuit portion 34 includes the protective structure 12, conductive films or conductive structures 38, bonding pads 40 and vias 42. The non-circuit portion 36 includes alignment structures 44 that are defined by alignment marks 18 and any conventional selected test structures (not shown).

The protective structure 12 is defined in each layer 26, 28, 30 and 32 with the protective structure 12 associated with each layer being in alignment thereby defining a wall that extends in a vertical direction from the substrate 24 to the uppermost layer 32 of the thin film circuit 10. The protective structure 12 extends within each of the layers of the thin film circuit 26, 28, 30 and 32 in a horizontal direction so as to separate, at least partially, the circuit portion 34 from the non-circuit portion 36. The protective structure 12, as will be discussed in more detail later, protects the circuit portion 34 of the thin film circuit 10 during machining. Machining of the thin film circuit 10 is often necessary to remove the non-circuit portion 36 from the circuit portion 34 thereby reducing the size of the thin film circuit 10. In addition, it may be necessary to machine the thin film circuit 10 to a shape that conforms to an interior shape or form of a chassis in which the machined thin film circuit 10' is to be mounted.

The protective structure 12, the conductive structures 38, bonding pads 40, vias 42 and alignment structures 44 for each layer 26, 28, 30 and 32 included in the thin film circuit 10 shown in FIG. 2 are formed using the photographic transfer of patterns from a series of masks to an upper surface 46 of the thin film circuit 10. The photographic transfer is performed with a photolithographic process that makes use of an ultraviolet (UV) light source (not shown) to expose a photosensitive coating known as photoresist or resist on the upper surface 46 of the thin film circuit 10. Photolithographic processes are known and therefore will not be described in detail. However, a portion of the photolithographic process that is used in the formation of vias is similar to the process used to define the protective structure 12 and therefore will be discussed in some detail.

The photolithographic process used to define the thin film circuit 10 makes use of a sequence of masks one of which is disposed between the UV light source and the upper surface 46 of each of the layers 26, 28, 30 or 32 to selectively expose portions of the photoresist on the upper surface 46 of each layer 26, 28, 30 and 32. If a negative acting photoresist is used, portions of the photosensitive photoresist not covered by opaque portions of the circuit mask polymerize and harden after exposure. The unexposed parts of the resist can then be dissolved and washed away, leaving a photoresist mask on the upper surface 46. If a positive acting resist is used, the portions under the opaque sections of the mask are left to define a photoresist mask on the upper surface 46.

The photoresist mask is then used to define conductive structures 38, bonding pads 40, vias 42, alignment structures 44 and the protective structure 12. A deposition process such as a plating operation is used to apply a conductive material to a conductive seed layer exposed by the photoresist mask. This conductive seed layer can be made of titanium, copper or a similar material known in the art. The selective application of conductive material to the upper surface 46 of each of the layers 26, 28, 30 and 32 is used to define the conductive structures 38, bonding pads 40, vias 42, alignment structures 44 and protective structure 12. A dielectric layer such as polyimide represented by thin film circuit layers 26, 28, 30 and 32 is deposited on top of the conductive material to prevent adjacent conductive structures 38 from unintentionally shorting.

The protective structure mask 14 of the present invention is used in conjunction with the previously mentioned photolithographic process that was used to define conductive structures 38, bonding pads 40 and alignment structures 44 for the thin film circuit 10. A masking process that will now be described that makes use of the protective structure mask 14. This masking process is required for each layer 26, 28, 30 and 32 that is included in the thin film circuit 10. The process for forming the protective structure 12 is similar to a conventional process for forming vias or vertical interconnections 42.

In one preferred embodiment, a positive photoresist deposited on the upper surface 46 of the thin film circuit 10. With the protective structure mask 14 disposed between the UV light source, the thin film circuit is exposed to ultraviolet light. The portions of the photosensitive resist covered by the protective structure masking portions 16 polymerize and harden after exposure. The unexposed parts of the resist can then be dissolved and washed away, leaving a photoresist mask on the upper surface 46 of the thin film circuit 10. Next, a plating operation is performed to plate a conductive material such as copper which bonds to the exposed conductive seed layers forming at least a portion the protective structure 12. In this manner, the protective structure mask 14 is used to define portions of the protective structure 12 for each layer 26, 28, 30 and 32 of the thin film circuit 10 thereby forming the complete protective structure 12 that extends from the substrate portion through each of the layers 26, 28, 30 and 32 of the thin film circuit 10.

The alignment marks 18 on the protective structure mask 14 and alignment structures 44 that are defined on each layer of the thin film circuit 10 help assure that successive layers of conducting material used to form the protective structure 12 are properly aligned thereby forming a vertical wall structure.

Thin film circuit layers 26, 28, 30 and 32, having vias connected thereto, make use of circuit masks that define these via locations. For these layers, the protective structure mask 14 and circuit mask for defining vias can be combined into one mask, as shown in FIG. 1, that includes protective structure masking portions 16 for defining the protective structure 12 and via masking portions 20 for defining vertical interconnects. Therefore, an extra masking step is only required for thin film circuit layers 26, 28, 30 and 32 that do not include vias. This extra masking step utilizes the protective structure mask 14 to define the protective structure 12 within those layers that do not have via connections therein.

In one preferred embodiment, one or more conductive structures 38 form a portion of the protective structure 12 as shown in circuit layer 26 of FIGS. 2 and 4. For this embodiment, the protective structure 12 can provide electrical interconnection between one of circuit layers 26, 28, 30 and 32 in addition to providing the protective structure 12 for preventing delamination during machining of the thin film circuit 10.

In one preferred embodiment, positive photoresist is exposed and the protective structure masking portion 16 is in a line of opaque material having a line width that is 0.001 inches in width. For this preferred embodiment, the protective structure mask 14 is a thin layer of glass having a layer of chromium applied to the surface to define the protective structure masking portions 16. For the case where negative photoresist is exposed, a protective structure mask is the negative photographic image of the protective structure mask 14 used for positive photoresist.

As previously discussed, the thin film circuit 10 may have more or less than the four layers 26, 28, 30 and 32 shown in FIG. 2. The protective structure 12 is defined for each layer of these thin film circuits 10 thereby forming a protective structure 12 that extends from the upper surface 46 to the substrate 24. In this manner, the height of the protective structure 12, or wall, varies depending on the number of layers that are required to make up the thin film circuit 10.

The completed thin film circuit 10 is machined to a selected shape. Machining separates the non-circuit portion 36 from the circuit portion 34 so that the thin film circuit 10' has a selected shape. In one preferred embodiment, the thin film circuit 10' is circular and has a smaller diameter concentric hole 22 therethrough, as shown in FIGS. 3 and 4. The thin film circuit 10 shown in FIG. 2 is machined along the protective structure 12 to form the machined thin film circuit 10' shown in FIGS. 3 and 4. The thin film circuit 10 is machined using conventional laser or ultrasonic machining techniques. The protective structure 12 deflects heat in the case of laser machining, and vibration in the case of ultrasonic machining, from the non-circuit portion 36 of the thin film circuit 10' thereby preventing delamination which is normally associated with laser or ultrasonic machining. The protective structure 12 prevents both delamination between adjacent layers of the dielectric material and delamination between the substrate and first layer of dielectric material.

The thin film circuit 10 may have a selected shape that is at least partially suitable for machining using conventional sawing techniques. In this case, the protective structure 12 need only be defined for those portions of the thin film circuit 10 which are required to be machined using conventional laser or ultrasonic machining techniques. In this manner, the protective structure 12 prevents delamination along those portions of the thin film circuit 10 machined using conventional laser or ultrasonic machining techniques.

For example, the thin film circuit 10 may be required to have a pie shape. For this case, two substantially straight or linear cuts are required and one curved or non-linear cut is required to separate the non-circuit portion 36 from the circuit portion 34 of the thin film circuit 10. For this case, the protective structure 12 need only be defined along the curved or non-linear portion of the circuit portion 34. Because conventional sawing techniques are suitable for cutting linear or straight cuts with minimal delamination, these two linear cuts can be made using conventional sawing techniques. However, because conventional sawing techniques are not well suited for non-linear or curved cuts, the use of a protective structure 12 along this portion of the pie shape allow the use of conventional laser or ultrasonic machining along this curved region without producing nicks or delamination of the circuit portion 34 of the thin film circuit 10.

Once the machining is complete and the thin film circuit 10' has the selected shape, the protective structure 12 can be etched away using conventional etching methods or the protective structure 12 can remain within the circuit portion 34 of the thin film circuit 10'. Electrical components such as integrated circuits can then be mounted to bonding pads on the upper surface 46 of the circuit portion 34 of thin film circuit 10' using conventional mounting techniques. The completed thin film circuit 10' having the selected shape and components mounted thereon is then mounted to a heat sink which is then mounted within a chassis. Alternatively, the completed thin film circuit having the selected shape and components mounted thereon can be mounted directly within the chassis.

In one preferred embodiment, the thin film circuit has a substrate material made from one of the following materials: alumina ($Al_2O_3$), beryllia (BeO), aluminum nitride (AlN), silicon carbide (SiC), aluminum, stainless steel, copper or copper/molybdenum/copper. In one preferred embodiment, the conductive material is made from one of the following: copper, gold, aluminum, nickel and solder $S_n63:Pb37$ alloy.

Although the present invention has been described with reference to preferred embodiments, workers skilled in the art will recognize that changes may be made in form and detail without departing from the spirit and scope of the invention.

What is claimed is:

1. A method for manufacturing a laminate structure to form a selected shape comprising:

laminating a first dielectric layer onto a surface of a substrate to form a laminate structure;

forming a first protective structure in the first dielectric layer and on the substrate utilizing a first photolithographic mask, at least a portion of the first protective structure defining the selected shape; and machining the laminate structure along the first protective structure to at least a portion of the selected shape.

2. The method for manufacturing a laminate structure of claim 1 further including forming a first conductive layer on at least a portion of the substrate with the first conductive layer being positioned between the substrate and the first dielectric layer.

3. The method for manufacturing a laminate structure of claim 2 wherein forming a first protective structure in the first dielectric layer and on the substrate includes forming the first protective structure on at least a portion of the first conductive layer.

4. The method for manufacturing a laminate structure of claim 2 further including:

laminating a second dielectric layer onto a surface of the first conductive layer; and forming a second protective structure in the second dielectric layer and on the first protective structure utilizing a second photolithographic mask, at least a portion of the second protective structure defining the selected shape.

5. The method for manufacturing a laminate structure of claim 4 further including forming a second conductive layer on at least a portion of the first dielectric layer with the second conductive layer being positioned between the first dielectric layer and the second dielectric layer.

6. The method for manufacturing a laminate structure of claim 5 wherein defining the first protective structure on the first dielectric layer includes defining at least one electrical interconnect between the first and second conductive layers.

7. The method for manufacturing a laminate structure of claim 1 further including:

laminating a plurality of dielectric layers on the first dielectric layer; and forming each of a plurality of protective structures in each of the plurality of dielectric layers utilizing a plurality of photolithographic masks with each of the plurality of protective structures in alignment with each other and with the first protective structure, and with one of the plurality of protective structures being on the first protective structure.

8. The method for manufacturing a laminate structure of claim 7 further including forming a plurality of conductive layers on at least a portion of each of the plurality of dielectric layers with adjacent conducting layers separated by each of the plurality of dielectric layers.

9. The method for manufacturing a laminate structure of claim 1 wherein the first dielectric layer is a dielectric material.

10. The method for manufacturing a laminate structure of claim 1 wherein the first dielectric layer is polyimide and the first protective layer is copper.

11. The method for manufacturing a laminate structure of claim 1 wherein forming a first protective structure includes:

positioning the first photolithographic mask between an energy source and the first dielectric layer;

removing a portion of the first dielectric layer to expose a portion of the surface of the substrate, the exposed portion of the surface of the substrate defining the selected shape; and adding protective material in the removed portion of the first dielectric layer and on the substrate, at least a portion of the first protective structure defining the selected shape.

* * * * *